United States Patent [19]
Petefish

[11] Patent Number: 5,879,787
[45] Date of Patent: Mar. 9, 1999

[54] METHOD AND APPARATUS FOR IMPROVING WIREABILITY IN CHIP MODULES

[75] Inventor: William George Petefish, Eau Claire, Wis.

[73] Assignee: W. L. Gore & Associates, Inc., Newark, Del.

[21] Appl. No.: 747,171

[22] Filed: Nov. 8, 1996

[51] Int. Cl.$^6$ ................................................. B32B 9/00
[52] U.S. Cl. ........................ 428/209; 428/901; 174/256; 174/258; 174/266; 156/902
[58] Field of Search ............................... 428/209, 901, 428/596, 212, 213; 174/256, 258, 266; 156/902

[56] References Cited

U.S. PATENT DOCUMENTS

| | | | |
|---|---|---|---|
| 3,953,566 | 4/1976 | Gore | 264/288 |
| 4,482,516 | 11/1984 | Bowman et al. | 264/127 |
| 4,642,160 | 2/1987 | Burgess | 156/630 |
| 4,680,220 | 7/1987 | Johnson | 428/901 |
| 4,705,762 | 11/1987 | Ota et al. | 501/87 |
| 4,959,119 | 9/1990 | Lantzer | 156/644 |
| 4,985,296 | 1/1991 | Mortimer, Jr. | 428/220 |
| 4,997,698 | 3/1991 | Oboodi et al. | 428/212 |
| 5,077,115 | 12/1991 | Arthur et al. | 428/209 |
| 5,108,553 | 4/1992 | Foster et al. | 205/125 |
| 5,224,265 | 7/1993 | Dux et al. | 29/852 |
| 5,245,751 | 9/1993 | Locke et al. | 29/852 |
| 5,300,812 | 4/1994 | Lupinski et al. | 257/702 |
| 5,314,788 | 5/1994 | Suzuki et al. | 428/209 |
| 5,320,894 | 6/1994 | Hasegawa | 428/209 |
| 5,378,313 | 1/1995 | Pace | 156/643 |
| 5,436,062 | 7/1995 | Schmidt et al. | 428/209 |
| 5,463,191 | 10/1995 | Bell et al. | 361/767 |
| 5,512,360 | 4/1996 | King | 428/209 |

FOREIGN PATENT DOCUMENTS 0 299 702  1/1989  European Pat. Off. .
96/12830  5/1996  WIPO .

OTHER PUBLICATIONS

Technical Paper "Low Cost Through–Hole Activation Method for PTFE Based Substitutes" By Stephen Kosto.
Lin et al., "Processability of Ultra–Thin, Laminates for High Performance Interconnect Applications" ICEMM Proceedings vol. 1986, 14–16 Apr. 1993, Denver CO., pp. 588–594.

*Primary Examiner*—William Krynski
*Assistant Examiner*—Cathy F. Lam
*Attorney, Agent, or Firm*—Victor M. Genco, Jr.

[57] ABSTRACT

A method of making a laminated structure includes forming a first lamination having first and second conductive layers having inner and outer surfaces and being spaced apart by a dielectric layer, drilling through the first conductive layer and dielectric layer to form a blind via having a bottom coexistent with the inner surface of the second conductive layer, plating the blind via with a conductive material, and patterning the second conductive layer to form at least one contact pad over the blind via.

2 Claims, 9 Drawing Sheets

METHOD AND APPARATUS FOR IMPROVING WIREABILITY IN CHIP MODULES

FIELD OF THE INVENTION

The present invention relates generally to the field of microelectronic fabrication and, more particularly, to a method of improving wiring density in an integrated circuit package.

BACKGROUND OF THE INVENTION

Multi-layered modules or packages are in widespread use in the semiconductor industry to mechanically support and electrically connect integrated circuit chips. Modules can be configured to mount a single chip or multiple chips, thus giving rise to the designations "SCM" for single chip modules and "MCM" for multi-chip modules.

A module supplies the chip with signals and power, and performs other functions such as heat removal, physical support and protection from the environment. Another important function is simply to redistribute the tightly packed I/Os of the chip to the I/Os of a printed wiring board.

A typical module, whether a SCM or MCM, is made of multiple layers of alternatingly arranged dielectric and conductive layers. The conductive layers are patterned, typically using photolithographic techniques, and adjacent conductive layers can be electrically connected by forming vias through the dielectric layers. These connections enable the interconnection of a chip to its package, and the package to a corresponding printed wiring board (PWB). Proper via formation is thus an important aspect of building multi-level metal systems used to make packaging.

In many chip packaging techniques, bonding pads are formed on the outer surfaces of the package over vias to facilitate chip/package/PWB connections. Bonding pads of the package must be precisely formed and accurately positioned to ensure proper electrical and mechanical connection. Moreover, where solder balls are formed on the bonding pads, such as in flip-chip packaging, properly formed bonding pads are a prerequisite to a well formed solder ball.

Figure 1:
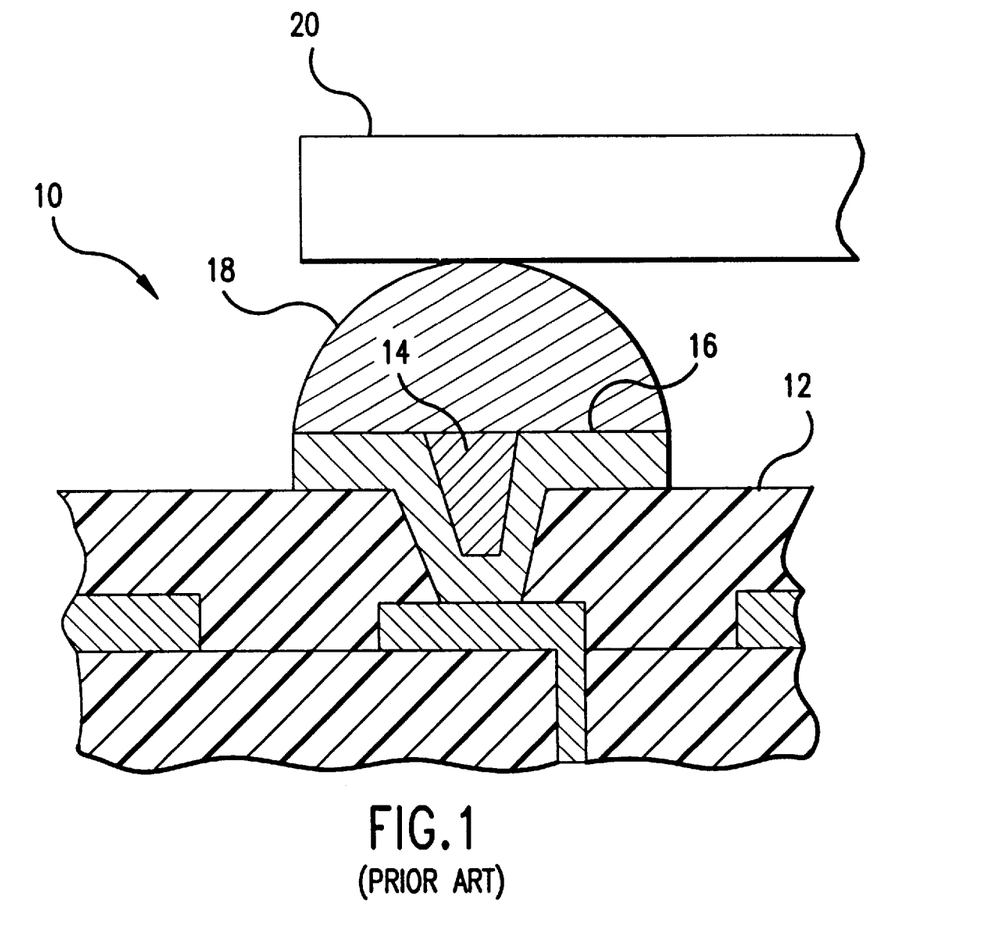
FIG. 1 is a sectional view of a known contact pad and solder ball configuration.

A known method of forming a bonding pad/solder ball connection is shown in FIG. 1. A blind via is formed by drilling a laminated substrate 10 from the outer surface-side of the substrate. The drilling step removes material from the upper-most dielectric layer 12 to form a slightly tapered recess. Next, the recess is plated with conductive material using any of the deposition techniques that are well known in the microelectronic fabrication art. The plated recess is then filled with a conductive filler material 14.

The filler material must be leveled to be coplanar with the outer surface of the outer conductive layer 16. A solder ball 18, formed on the conductive layer 16, is then used to connect the substrate 10 to an integrated circuit chip 20. The area under the solder ball 16 is patterned to form a bonding pad.

While the above process makes an adequate connection, it is relatively difficult and costly to level the filler in the blind via to make it co-planar with the conductive layer 16. If the blind via is not completely filled, contaminants can become entrapped causing problems in later soldering operations.

Figure 2:
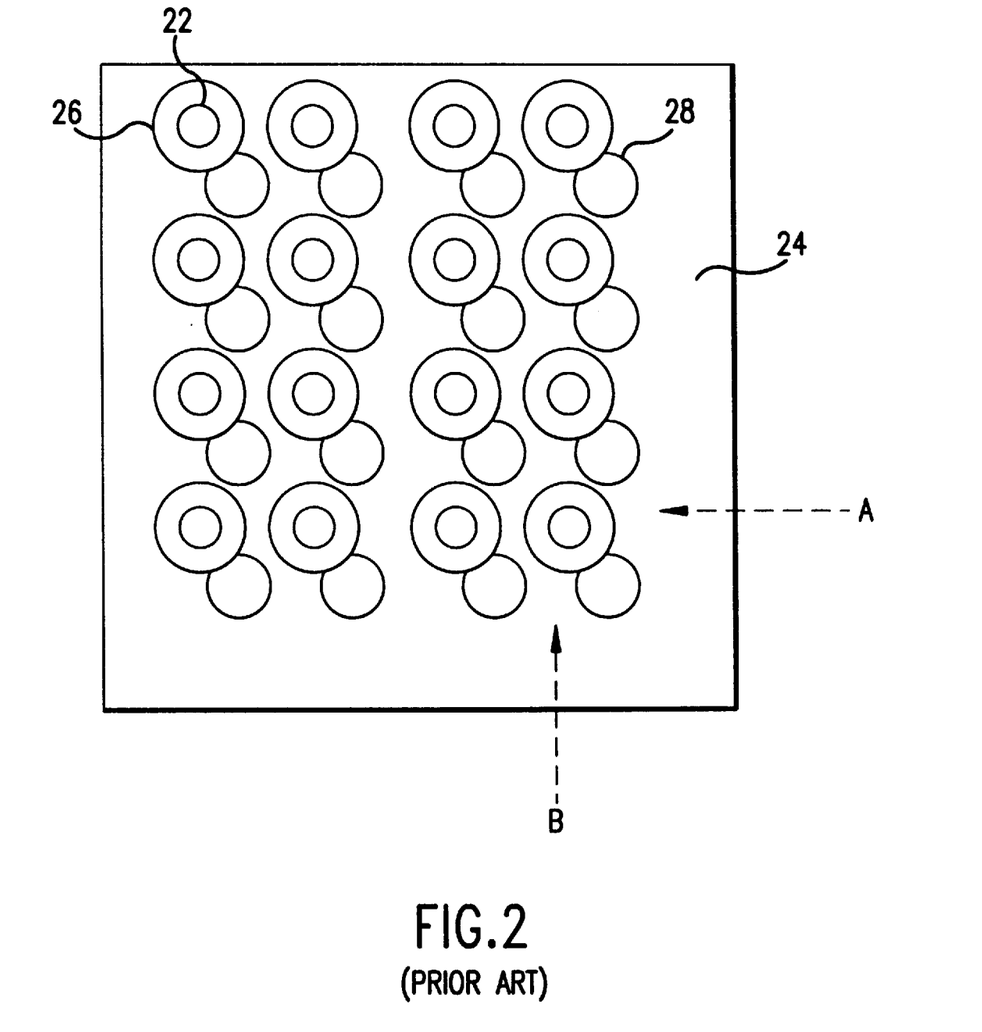
FIG. 2 is a top plan view of a substrate illustrating conventional restricted wiring channels that are endemic with separately formed via capture pads and chip attach capture pads.

Another technique for forming circuit interconnects, illustrated in FIG. 2, involves forming through vias 22 in a laminated substrate 24, plating the vias, and then forming via capture pads 26 on top of the vias 22. Separate chip attach capture pads 28 are connected to respective ones of the via capture pads 26. The chip attach capture pads 28 provide an area to attach the chip solder balls (not shown). In this arrangement, the via capture pads are covered by a solder mask (not shown) to prevent solder from flowing down the through vias 22.

Although the separate capture pads 26 are commonly used, they take up a large amount of space, thus limiting the ability to route signal lines between the pads, as shown by the broken-line directional arrows "A" and "B" of FIG. 2. These arrows represent restricted routing channels and thus a limitation on the wiring density of the package.

SUMMARY OF THE INVENTION

An object of the present invention is to provide a method for improving wireability in chip modules that reduces processing steps and thus cost of manufacture.

Another object of the present invention is to provide a method for improving wireability in chip modules by eliminating the necessity to form via capture pads separately from chip attach capture pads.

Still another object of the invention is to provide a method of forming laminated structures for use in microelectronic fabrication which result in thinner packaging, higher integration and higher routability of the wiring layers.

These and other objects are met by providing a method of making a laminated structure which includes the steps of forming a first lamination having first and second conductive layers having inner and outer surfaces and being spaced apart by a dielectric layer, drilling through the first conductive layer and dielectric layer to form a blind via having a bottom coexistent with the inner surface of the second conductive layer, plating the blind via, and patterning the second conductive layer to form at least one contact pad over the blind via.

These together with other objects and advantages which will be subsequently apparent, reside in the details of construction and operation as more fully hereinafter described and claimed, with reference being had to the accompanying drawings forming a part hereof, wherein like numerals refer to like elements throughout.

DETAILED DESCRIPTION OF THE PREFERRED EMBODIMENTS

The methodology of the present invention entails sequential processing steps in which a laminated structure is formed. This laminated structure achieves improved wireability by virtue of the manner in which the contact pads of the outer surface of the structure are formed.

Figure 3:
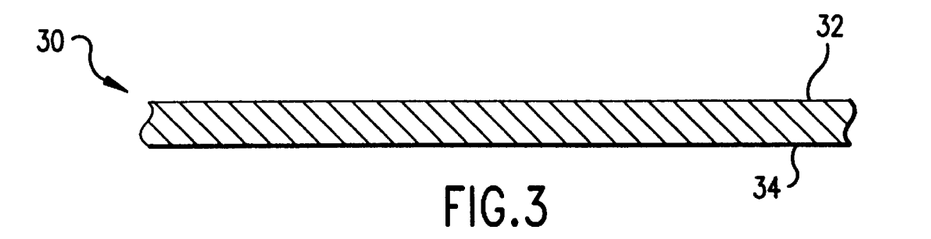
FIG. 3 is a vertical sectional view of a metal core used to form a laminated structure of the present invention.
Figure 4:
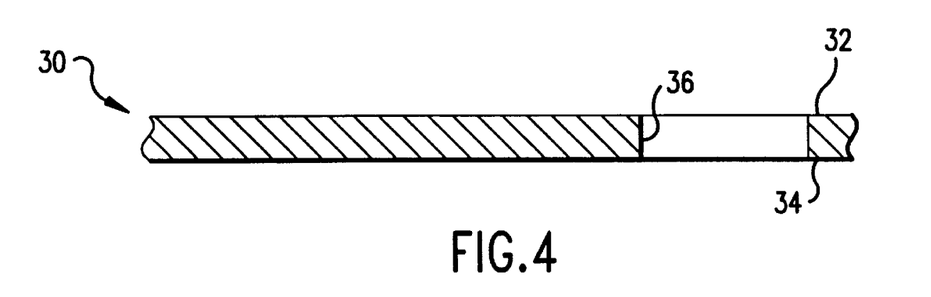
FIG. 4 is a vertical sectional view of the metal core of FIG. 3 after pattering same to form openings.

Referring to FIGS. 3 and 4, a metal core 30 has opposite planar surfaces 32 and 34. The metal core can be made of any suitable conductive material, such as copper. The core is patterned to form a plurality of openings, of which opening 36 is shown in FIG. 4. Any of the known patterning techniques, such as those based on photolithography, can be employed.

Figure 5:
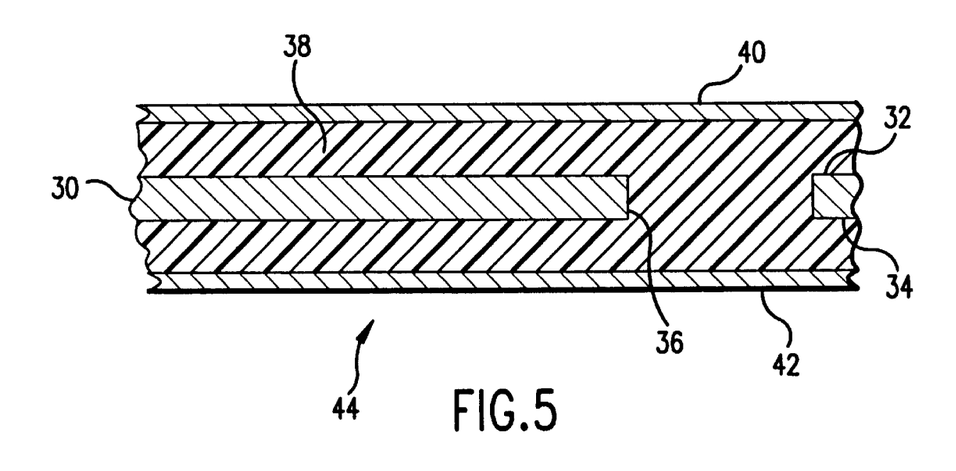
FIG. 5 is a vertical sectional view of the patterned core of FIG. 4 after lamination with dielectric and metal layers.

As seen in FIG. 5, the core 30 is placed between two dielectric layers 38 and two conductive layers 40 and 42. A laminate 44 is formed when the various layers are placed in a press which applies a consolidation force. The dielectric layers are in a b-stage when pressed which facilitates the lamination process to yield a unitary, multi-layered structure having a metal core and outer metal layers. During lamination, dielectric material from the two layers flows into and fills the opening 36.

The dielectric layers are preferably made of an organic material such as polytetrafluoroethylene (PTFE), and more particularly, an expanded PTFE or "ePTFE" which is impregnated with cyanate ester and epoxy. A more detailed description of the dielectric materials will be provided below.

Figure 6:
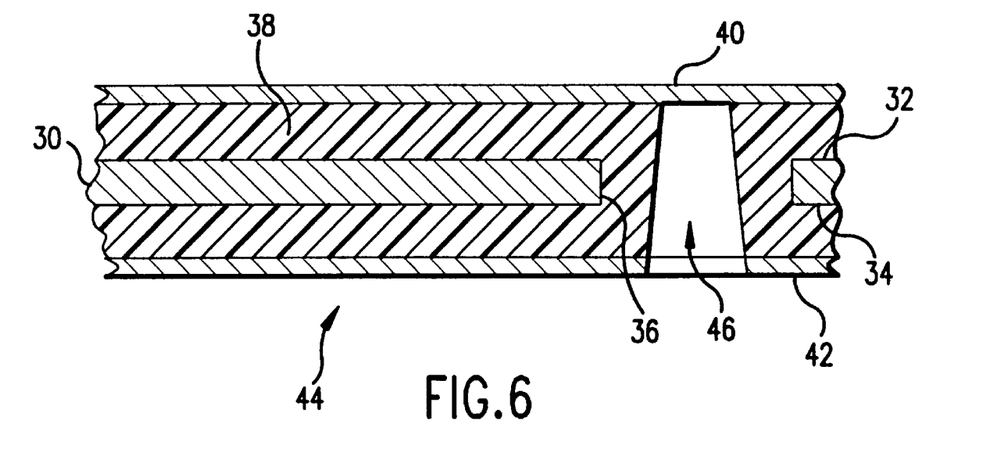
FIG. 6 is vertical sectional view of the laminated structure of FIG. 5 after formation of a blind via.

As seen in FIG. 6, a blind via 46 is formed in the laminated structure 44 by drilling from the conductive layer 22 side of the structure. The blind via 46 opens from the conductive layer 22 and extends through the dielectric layers 38 to a depth coincident with the inner surface of the conductive layer 40.

Preferably, the blind via 46 is drilled using a laser drilling technique. In particular, when the dielectric layers 38 are made of an organic PTFE-based material, a Nd:YAG pulsed laser is used at either the third or fourth harmonic to produce an ultraviolet beam at either 266 nm or 355 nm. A slight taper is characteristic of the laser drilling technique, and the direction of the taper indicate that the beam was directed from the lower side of the structure, given the orientation of the Figures.

While the Nd:YAG lasers are particularly suited for drilling vias, other lasers can be employed, including excimer lasers and $CO_2$ lasers. A more detailed description of a laser drilling apparatus follows capable of use to implement the present invention follows.

Figure 7:
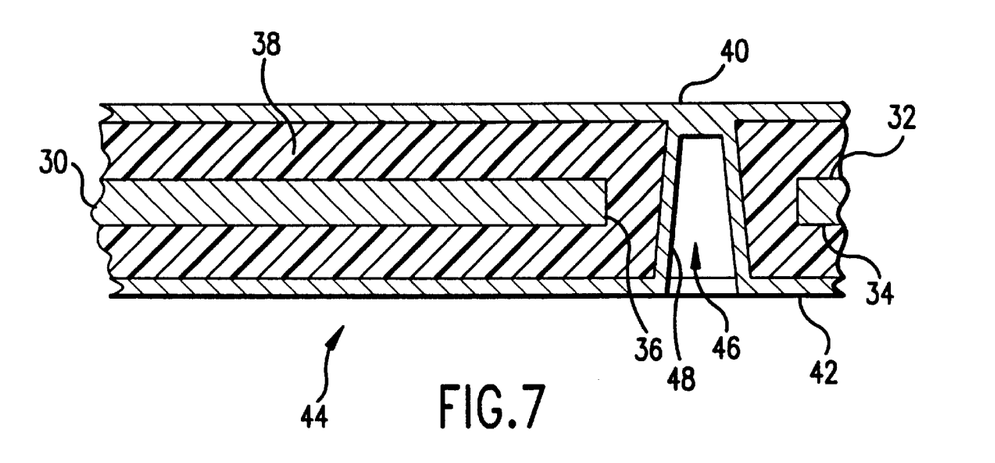
FIG. 7 is a vertical sectional view of the laminated structure of FIG. 6 after plating of the blind via.
Figure 8:
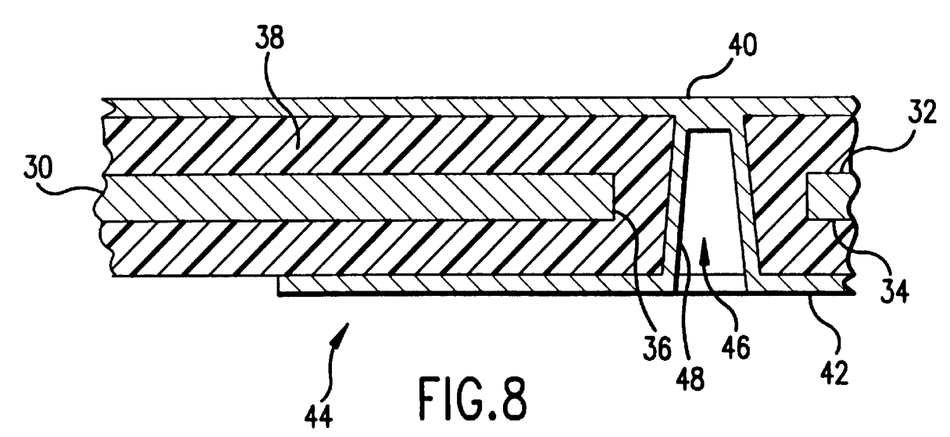
FIG. 8 is a vertical sectional view of the laminated structure after forming metal patterns on the outer metal layers.

Subsequent to formation of the blind via, and as seen in FIG. 7, the blind via 46 is plated with a conductive material 48 that interconnects the two conductive layers 40 and 42. Any of the known plating techniques can be employed to form the plating, including electroless plating in which a copper film is formed on the via walls.

Figure 9:
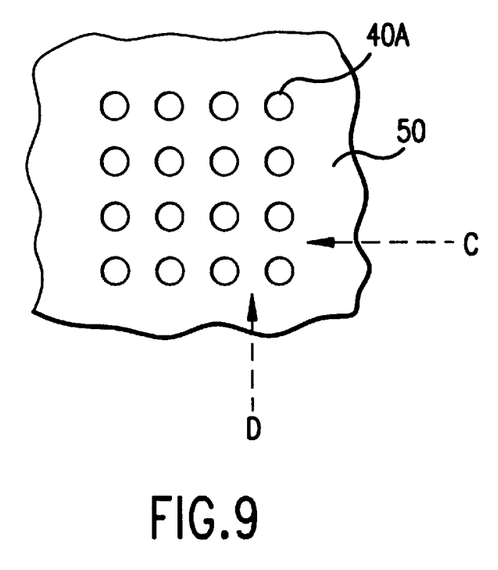
FIG. 9 is a plan view of a contact pad region of the laminated structure formed according to the sequential steps of the present invention.

Following plating, the outer conductive layers are patterned using standard photolithographic techniques to form contact pads, as seen in FIG. 9. The contact pads can be used to make any number of connections. For example, as seen in FIG. 9, a plurality of contact pads 40a are shown in a pattern for connecting a chip to the laminated structure 50. The contact pads function as chip attach pads and provide unrestricted routing channels on the exterior of the laminated structure 50, along broken-lines directional arrows "C" and "D." As compared to FIG. 2, it can readily be seen that the routing channels which can be achieved in FIG. 9 are much less restricted than those capable from FIG. 2. This improvement in wireability eliminates internal layers which in turn results in increased cost savings because all the routing of wires are on the top and bottom layers of the chip module. Because internal wiring layers can be eliminated, a thinner package results or a higher integration of the module can be achieved.

Figure 10:
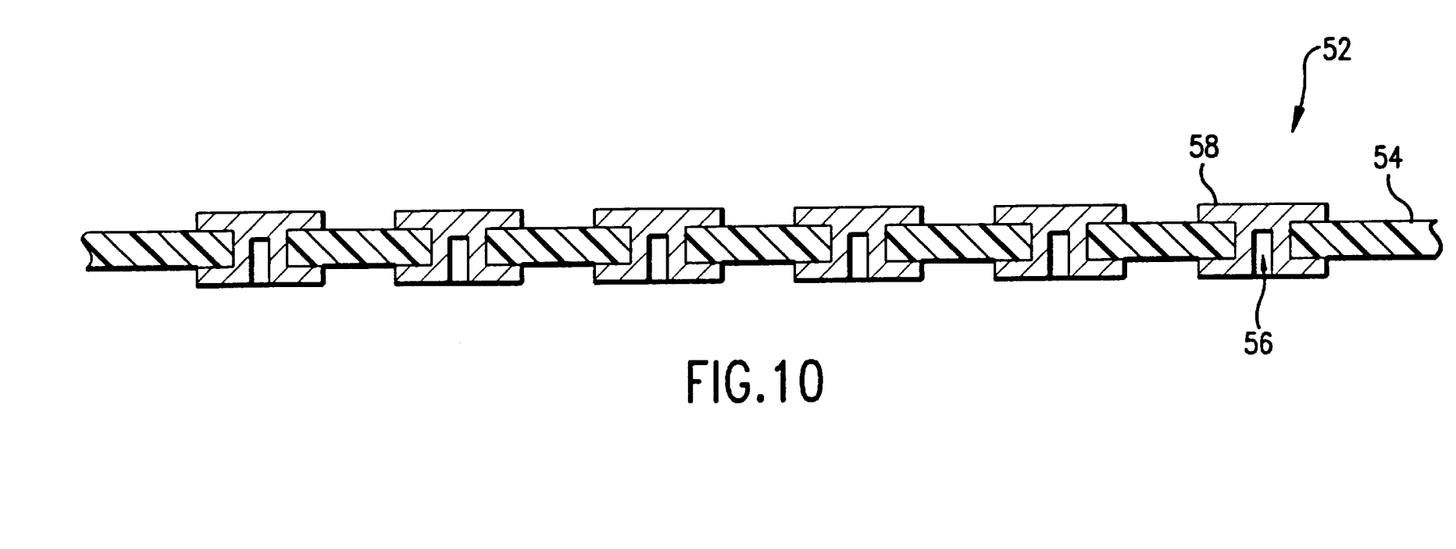
FIG. 10 is a vertical sectional view of another laminate made according to the present invention.

FIG. 10 is a vertical sectional view of a three-layered embodiment of the present invention in which a substrate 52 includes a dielectric layer 54 laminated between two conductive layers. According to the previously-described methodology, blind vias 56 are formed through the lower conductive layer and the dielectric layer 54, terminating at the inner surface of the upper conductive layer. After plating the vias, the two conductive layers are patterned to form a plurality of chip attach pads 58 which can be arranged in an X-Y grid as in FIG. 9.

Since the embodiment of FIG. 10 does not include a core conductive layer, the dielectric layer can either be laser ablated to form the vias or photodefined using standard photolithographic techniques.

Laser System For Forming Vias

Figure 11:
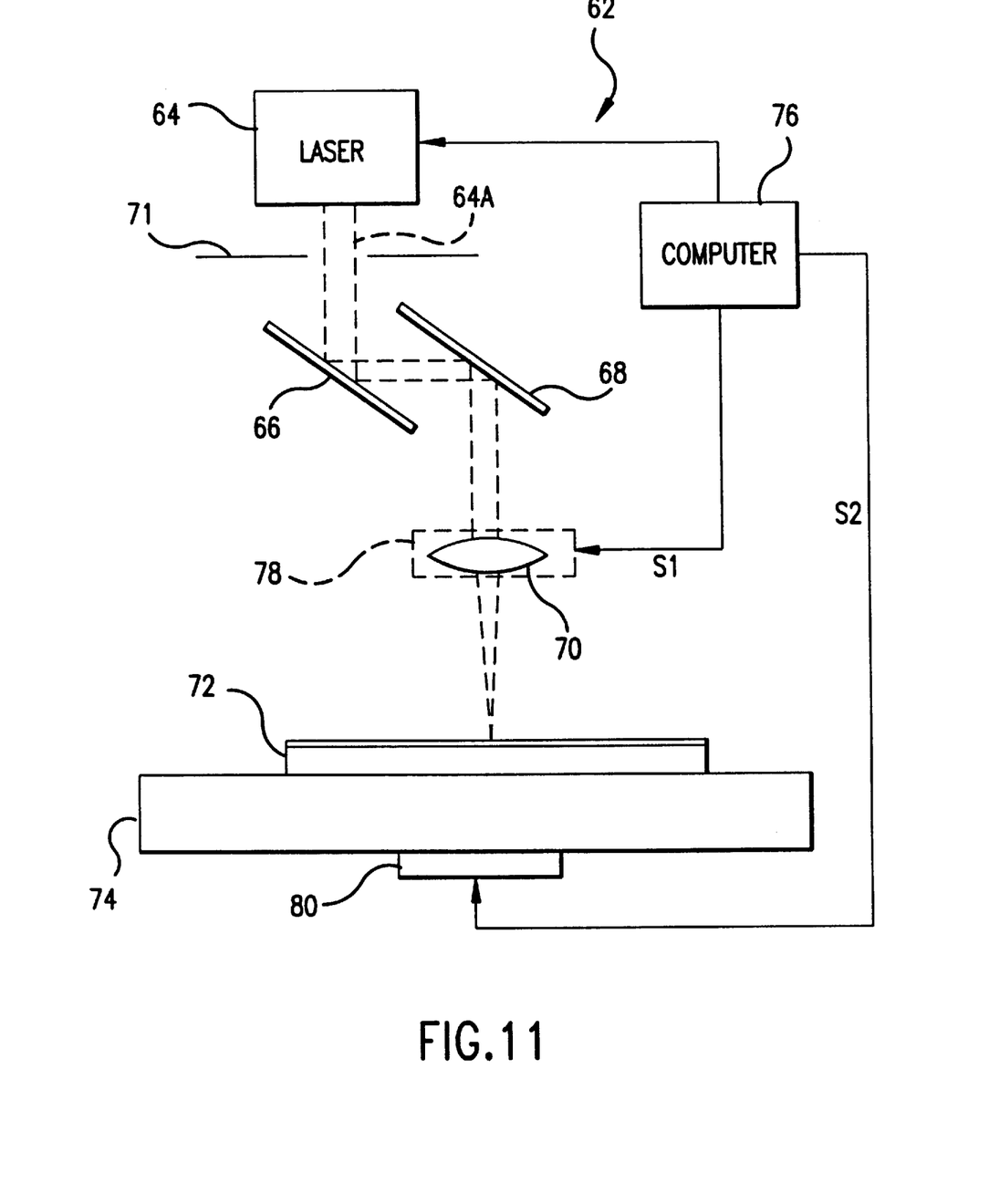
FIG. 11 is a schematic view of a laser system used to form vias in the laminated structures according to the present invention.

The blind vias described above are formed using the laser system 62 shown in FIG. 11. The laser system 62 includes a laser source 64 which outputs a pulsed laser beam 64a that is directed through a laser optic system. The optic system includes mirrors 66 and 68, and a focusing lens 70 which directs a focused beam onto a multi-layered substrate 72, which is positioned on an X-Y positioning table 74.

The focused beam forms a focal spot on the substrate 72 which corresponds to the multi-layered laminate 44 of FIGS. 5–8. When readied for laser ablation, the laminate 44 is positioned up-side down given the orientation of the Figures, so that the conductive layer 40 is on the X-Y table 74 and the conductive layer 42 faces the laser. The substrate 72 does not have to correspond precisely to that shown in FIGS. 5–8, and can have a plurality of additional alternately disposed dielectric and conductive layers.

The laser system 62 includes means for controlling the position of the focal spot of the laser beam with respect to the substrate 72. The controlling means may be a computer 76 that controls the positioning of the focal spot by issuing control signals S1 to an actuator 78 which moves the lens 70 in the X direction. The computer further issues control signals S2 to an actuator 80 which moves the X-Y positioning table in the Y direction. The combined X and Y motion allows the system 62 to move the laser beam in a manner programmed by the computer to form a desired type of via.

Other X-Y positioning may be employed, including galvanometers to control the position of the mirrors 66 and 68. These are commercially available and can be installed in commercially available laser apparatuses. In any event, the computer 76 can be pre-programmed to establish the pattern of motion of the beam spot to form the desired vias. Moreover, the computer 76 is operatively coupled to the laser source 64 to establish lasing parameters such as velocity of the beam path (in millimeters per second), pulse repetition rate, pulse length, and power.

To make a virtually instantaneous in situ change in laser energy density, the computer 76 can implement a change in any one of several control parameters, such as the pulse length.. Pulse length can be varied in several ways, including cavity dumping, modelocking and Q-switching. Q-switching depends on the type of laser used, and there are several basic types, including a rotating mirror, an active modulator using an acousto-optic device, and a passive saturable dye cell.

The preferred pattern of movement of the laser focal spot is "trepanned" in which the beam spot starts in the center of the desired via, and gradually spirals outwardly to an outer diameter of the via. At that point the beam is caused to orbit around the via center for as many revolutions as is determined necessary for the particular via. Upon completion, the focal spot is caused to spiral back to the center and thereafter awaits the next command. An example of a trepanning velocity is 3 millimeters per second.

Choice of laser is important to the present invention. The preferred lasers are pulsed solid state lasers such as the frequency-tripled Nd:YAG (neodymium yttrium aluminum garnet) laser emitting at a 355 nm wavelength or a frequency-quadruped Nd:YAG laser emitting at a 266 nm wavelength. The basic laser is commercially available as the Model 5000 Laser Processing System produced by Electro Scientific Industries of Portland Oreg. U.S.A. As noted earlier, however, other lasers may be employed, such as excimer lasers and $CO_2$ lasers.

In changing the laser energy density in situ, the computer can control the Q-switch to vary the pulse repetition rate. The following Table demonstrates how the laser energy and power change with repetition rate for the 355 nm Nd:YAG laser:

TABLE

| Rep. Rate (Hz) | Average Power(mW) | Pulse Width(nm) | Energy per Pulse($\mu$J) | Power per Pulse |
|---|---|---|---|---|
| 2000 | 680 | 40 | 340 | 8.5 |
| 3000 | 770 | 48 | 255 | 5.3 |
| 4000 | 770 | 55 | 195 | 3.5 |
| 5000 | 725 | 63 | 145 | 2.3 |
| 6000 | 685 | 70 | 115 | 1.6 |
| 7000 | 630 | 78 | 90 | 1.2 |
| 8000 | 580 | 85 | 75 | .9 |
| 9000 | 535 | 93 | 60 | .6 |
| 10000 | 500 | 100 | 50 | .5 |

Similarly, the following Table demonstrates how the laser energy and power change with repetition rate for the 266 nm Nd:YAG laser:

TABLE

| Rep. Rate (Hz) | Average Power(mW) | Pulse Width(nm) | Energy per Pulse($\mu$J) | Power per Pulse |
|---|---|---|---|---|
| 2000 | 330 | 40 | 165 | 4.1 |
| 3000 | 380 | 48 | 125 | 2.6 |
| 4000 | 350 | 55 | 90 | 1.6 |

TABLE-continued

| Rep. Rate (Hz) | Average Power(mW) | Pulse Width(nm) | Energy per Pulse($\mu$J) | Power per Pulse |
|---|---|---|---|---|
| 5000 | 290 | 63 | 60 | 1.0 |
| 6000 | 280 | 70 | 45 | 0.6 |
| 7000 | 240 | 78 | 35 | 0.4 |
| 8000 | 180 | 85 | 25 | 0.3 |
| 9000 | 140 | 93 | 15 | 0.2 |
| 10000 | 130 | 100 | 15 | 0.1 |

When the laser focal spot geometry is added to the above, energy density can be calculated. The energy density is one of the primary parameters for setting laser ablation of the substrates to form vias in the organic substrates described herein.

Dielectric Materials

Any suitable dielectric material can be used in the present invention, such as, but not limited to, polyimides and polyimide laminates, epoxy resins, epoxy resins in combination with other resin material, organic materials, alone or any of the above combined with fillers. Preferred dielectric materials include a fluoropolymer matrix, where the fluoropolymer can be PTFE, ePTFE or copolymers or blends. Suitable fluoropolymers include, but are not limited to, polytetrafluoroethylene or expanded polytetrafluoroethylene, with or without an adhesive filler mixture.

Preferred materials include Speedboard® bond plies available from W. L. Gore and Associates, Inc., such as, Speedboard® C which is a prepreg of non-woven material containing a cyanate ester resin in a polytetrafluoroethylene matrix. Speedboard® C has a dielectric constant, Dk of is 2.6–2.7 at 1 MHz–10 GHz, a loss tangent of 0.004 at 1 MHz–10 GHz, a dielectric strength V/mil greater than 1000, a glass transition and a $T_g$ of 220° C., a resin content of 66–68 wt. % and is available in a variety of thicknesses. Also Speedboard® N prepregs which are multiepoxy adhesives in a expanded PTFE matrix may also be used. Speedboard® N has a dielectric constant (Dk) of 3.0 at 1 MHz, a loss tangent of 0.02 at 1 MHz, a dielectric strength V/mil greater than 900, a glass transition and a $T_g$ of 140° C., a resin content of 66–68 wt. % and is available in a variety of thicknesses.

Figure 12:
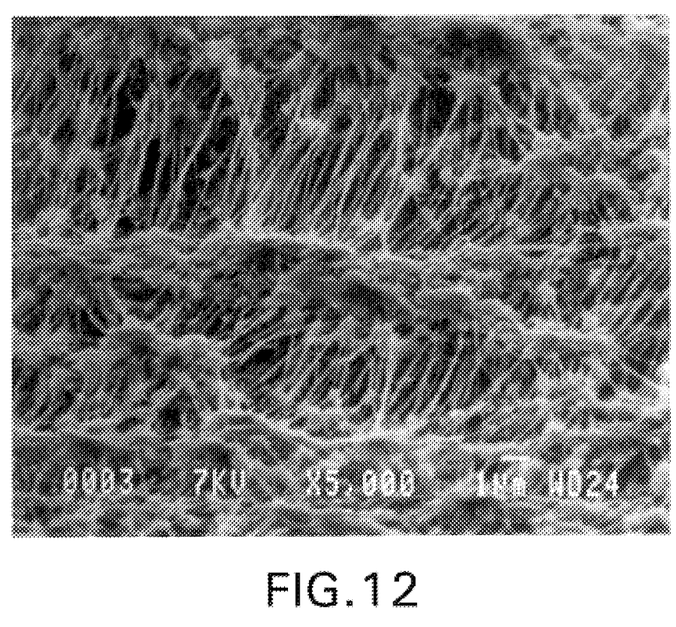
FIG. 12 is an scanning electron microscope (SEM) image of a preferred dielectric comprised of expanded polytetrafluoroethylene (ePTFE) material impregnated with epoxy.

Another dielectric is an expanded PTFE matrix, shown in FIG. 12, that includes a mixture of at least two of a cyanate ester compound, an epoxy compound, a bis-triazine compound and a poly (bis-maleimide) resin. For example, a varnish solution is made by mixing 5.95 pounds of M-30 (Ciba Geigy), 4.07 pounds of RSL 1462 (Shell Resins, Inc.), 4.57 pounds of BC-58 (Great Lakes Inc.), 136 g bisphenol A (Aldrich Company), 23.4 g Irganox 1010, 18.1 g of a 10% solution of Mn HEX-CEM in mineral spirits, and 8.40 kg MEK. The varnish solution was further diluted into two separate baths—20% (w/w) and 53.8% (w/w). The two varnish solutions were poured into separate impregnation baths, and an e-PTFE web was successively passed through each impregnation bath one immediately after the other. The varnish was constantly agitated so as to insure uniformity. The impregnated web was then immediately passed through a heated oven to remove all or nearly all the solvent and partially cure the adhesives, and was collected on a roll. The ePTFE web may be any desired thickness, such as 25 $\mu$m, 40 $\mu$m or thicker. A 25 $\mu$m thick material has a mass of approximately 0.9 g and a weight per area of approximately 11.2 to 13.8 $g/m^2$.

Other classes of dielectric materials include those where a porous matrix system contains an imbibed or impregnated adhesive-filler mixture. The porous matrix is a non-woven substrate that is imbibed with high quantities of filler and a thermoplastic or thermoset adhesive, as a result of the initial void volume of the substrate, heated to partially cure the adhesive and form a B-stage composite. Substrates include fluoropolymers, such as the porous expanded polytetrafluoroethylene material of U.S. Pat. Nos. 3,953,566 and 4,482,516, each of which is incorporated herein by reference. Desirably, the mean flow pore size (MFPS) should be between about 2 to 5 times or above that of the largest particulate, with a MFPS of greater than about 2.4 times that of the filler being particularly preferred. However, it is also within the scope of the invention that suitable composites can be prepared by selecting a ratio of the mean flow pore size to average particle size to be greater than 1.4. Acceptable composites can also be prepared when the ratio of the minimum pore size to average particle size is at least above 0.8, or the ratio of the minimum pore size to the maximum particle size is at least above 0.4. The MFPS to particle size ratios may be determined with a Microtrak® Model FRA Particle Analyzer device.

Alternatively, another mechanism for gauging relative pore and particle sizes may be calculated as the smallest pore size being not less than about 1.4 times the largest particle size.

In addition to expanded fluoropolymer substrates, porous expanded polyolefins, such as ultra high molecular weight (UHMW) polyethylene, expanded polypropylene, polytetrafluoroethylene made prepared by paste extrusion and incorporating sacrificial fillers, porous inorganic or organic foams, or microporous cellulose acetate, can also be used.

The porous substrate has an initial void volume of at least 30%, preferably at least 50%, and most preferably at least 70%, and facilitates the thermoset or thermoplastic adhesive resin and particulate filler paste in the voids while providing a flexible reinforcement to prevent brittleness of the overall composite and settling of the particles.

The filler comprises a collection of particles when analyzed by a Coulter® Porometer II device, display a histogram maximum particle size, a minimum particle size and an average particle size.

Suitable fillers to be incorporated into the adhesive $BaTiO_2$, $SiO_2$, $Al_2O_3$, ZnO, $ZrO_2$, $TiO_2$, precipitated and sol-gel silicas, non-conductive carbon (carbon black) and mixtures thereof. Especially preferred fillers are $SiO_2$, $ZrO_2$, $TiO_2$ alone or in combination with non-conductive carbon. Most preferred fillers include filler made by the vapor metal combustion process taught in U.S. Pat. No. 4,705,762, such as, but not limited to silicon, titanium and aluminum to produced silica, titania, and alumina particles that are solid in nature, i.e., not a hollow sphere, with a uniform surface curvature and a high degree of sphericity.

The fillers may be treated by well-known techniques that render the filler hydrophobic by using coupling agents. Suitable coupling agents include, silanes, silanol, titanates, zirconates, and aluminates. Suitable silylating agents may include, functional silyating agents, silizanes, disilazanes, siloxanes, but are not limited to, silazanes such as hexamethyldisilazane (Huls H730) and hexamethylcyclotrisilazane, silylamides such as bis(trimethylsilyl)acetamide (Huls B2500), silylureas such as trimethylsilylurea, and silylmidazoles such as trimethylsilylimidazole.

Titanate coupling agents are exemplified by the tetra alkyl type, monoalkoxy type, coordinate type, chelate type, quaternary salt type, neoalkoxy type, cycloheteroatom type. Preferred titanates include, tetra alkyl titanates, Tyzor® TOT {tetrakis(2-ethyl-hexyl) titanate, Tyzor® TPT {tetraisopropyl titanate}, chelated titanates, Tyzor® GBA {titanium acetylacetylacetonate}, Tyzor® DC {titanium ethylacetacetonate}, Tyzor® CLA {proprietary to DuPont}, Monoalkoxy (Ken-React® KR TTS), Ken-React®, KR-55 tetra (2,2 diallyloxymethyl)butyl, di(ditridecyl)phosphito titanate, LICA® 38 neopentyl(diallyl)oxy, tri(dioctyl)pyrophosphato titanate.

Suitable zirconates include, any of the zirconates detailed at page 22 in the Kenrich catalog, in particular KZ 55-tetra (2,2 diallyloxymethyl)butyl, di(ditridecyl)phosphito zirconate, NZ-01- neopentyl(diallyl)oxy, trineodecanoyl zirconate, NZ-09-neopentyl(diallyl)oxy, tri(dodecyl) benzene-sulfonyl zirconate. The aluminates that can be used in the present invention include, but are not limited to Kenrich®, KA 322 and KA 489.

In addition to the above, certain polymers, such as, cross-linked vinylic polymers, e.g., divinylbenzene, divinyl pyridine or a sizing of any of the disclosed thermosetting matrix adhesives that are first applied at very high dilution (0.1 up to 1.0% solution in MEK). Also, coupling agents prepared from the reaction of dicumylperoxide with fillers can also be used.

The adhesive itself may be a thermoset or thermoplastic and can include polyglycidyl ether, polycyanurate, polyisocyanate, bis-triazine resins, poly (bis-maleimide), norbornene-terminated polyimide, polydiborane, acetylene-terminated polyimide, polybutadiene, cyclic olefinic polycyclobutene and functionalized copolymers thereof, polysiloxanes, poly sisqualoxane, functionalized polyphenylene ether, polyacrylate, novolak polymers and copolymers, fluoropolymers and copolymers, melamine polymers and copolymers, poly(bis phenycyclobutane) and blends thereof. It should be understood that the aforementioned adhesives may themselves be blended together or blended with other polymers or additives, so as to impact flame retardancy or enhance toughness.

As used herein mean flow pore size and minimum pore size were determined using the Coulter® Porometer II (Coulter Electronics Ltd., Luton UK) which reports the value directly. Average particle size and largest particle size were determined using a Microtrak® light scattering particle size analyzer Model No. FRA (Microtrak Division of Leeds & Northup, North Wales, Pa., U.S.A.). The average particle size (APS) is defined as the value at which 50% of the particles are larger than. The largest particle size (LPS) is defined as the largest detectable particle on a Microtrak® histogram.

In general, the method for preparing the adhesive-filler dielectric involves: (a) expanding a polytetrafluoroethylene sheet by stretching a lubricated extruded perform to a microstructure sufficient to allow small particles and adhesives to free flow into the void or pore volume; (b) forming a paste from polymeric, e.g., thermoset or thermoplastic material and a filler; and (c) imbibing by dipping, coating, or pressure feeding, the adhesive-filler paste into the highly porous scaffold, such as expanded polytetrafluoroethylene.

To prepare the filled adhesive material, e.g., a layer, film, etc., of this invention, particulate filler is mixed into a solvent or aqueous solution or molten adhesive to afford a finely dispersed mixture. The filler in small particle form is ordinarily less than 40 microns in size, and preferably has an average particulate size between 1 and 10 microns. The mean pore size of the node-and-fibril structure of the polytetrafluoroethylene should be large enough to allow for adequate penetration of the particulate.

Table 1 shows the effect of the relationship of the substrate mean flow pore size (MFPS) and particulate size. When the ratio of the mean flow pore size (MFPS) to largest particulate is 1.4 or less, poor results are observed. In this case, a homogeneous composite is not observed, and most of the particulate filler does not uniformly penetrate the microporous substrate. When the ratio of the MFPS to largest particulate is greater than about 2.0, then a uniform composite is obtained. It is also observed that the larger the ratio of MFPS to largest particulate, the greater the relative case it is to imbibe a homogeneous dispersion into the microporous substrate.

TABLE 1

| Desc. | Substrate Pore Size | | Particle Size | | MFPS ÷ Part$_{Avg}$ | Pore$_{min}$ ÷ Part$_{Max}$ | Pore$_{Min}$ ÷ Part$_{Avg}$ | Result |
|---|---|---|---|---|---|---|---|---|
| | Min (μm) | MFPS (μm) | Avg (μm) | Max (μm) | | | | |
| A | 4 | 7 | 5 | 10 | 1.4 | 0.4 | 0.8 | Poor |
| B | 4 | 5 | 5 | 10 | 1.0 | 0.4 | 0.8 | Poor |
| C | — | 58 | 5 | 10 | 12.4 | N/A | — | Good |
| D | 18 | 32 | 6 | 10 | 5.3 | 1.8 | 3.0 | Good |
| E | 18 | 32 | 1 | 1 | 32.0 | 18.0 | 18 | Good |
| F | 17 | 24 | 6 | 10 | 4.0 | 1.7 | 2.8 | Good |
| G | 0.2 | 0.4 | 0.5 | 1.6 | 0.8 | 0.125 | 0.4 | Poor |
| H | — | 60 | 18 | 30 | 3.3 | — | — | Good |
| I | 14 | 11 | 0.5 | 1.6 | 22.0 | 8.8 | 28 | Good |
| J | 14 | 29 | 4 | 8 | 7.3 | 1.8 | 3.5 | Good |
| K | 14 | 29 | 5 | 10 | 5.8 | 1.4 | 2.8 | Good |

Ceramic Adhesive-Filler Dielectric Composites

Example 1

A fine dispersion was prepared by mixing 281.6 g TiO$_2$ (Ti Pure R-900, Du Pont Company) into a 20% (w/w) solution of a flame retarded dicyanamide/2-methylimidazole catalyzed bisphenol-A based polyglycidyl ether (Nelco N-4002-5, Nelco Corp.) in MEK. The dispersion was constantly agitated so as to insure uniformity. A swatch of expanded PTFE was then dipped into the resin mixture. The web was dried at 165° C. for 1 min. under tension to afford a flexible, partially cured composite. The partially-cured adhesive composite thus produced comprised of 57 weight percent TiO$_2$, 13 weight percent PTFE and 30 weight percent epoxy adhesive. Several plies of the adhesive sheet were laid up between copper foil and pressed at 600 psi in a vacuum-assisted hydraulic press at temperature of 225° C. for 90 min. then cooled under pressure. This resulted in a copper laminate having dielectric constant of 19.0, and withstood a 30 sec. solder shock at 280° C. at an average ply thickness of 100 μm (0.0039" (3.9 mil)) dielectric laminate thickness.

Example 2

A fine dispersion was prepared by mixing 386 g SiO$_2$ (HW-11-89, Harbison Walker Corp.) which was pretreated with phenyltrimethoxysilane (04330, Huls/Petrarch) into a manganese catalyzed solution of 200 g bismaleimide triazine resin (BT206OBJ, Mitsubishi Gas Chemical) and 388 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible, partially cured composite. Several plies of this prepreg were laid up between copper foil and pressed at 250 psi in a vacuum-assisted hydraulic press at temperature of 225° C. for 90 min. then cooled under pressure. This resulting dielectric thus produced comprised of 53 weight percent SiO$_2$, 5 weight percent PTFE and 42 weight percent adhesive, displayed good adhesion to copper, dielectric constant (at 10 GHz) of 3.3 and dissipation factor (at 10 GHz) of 0.005.

Example 3

A fine dispersion was prepared by mixing 483 g SiO$_2$ (HW-11-89, Harbison Walker Corp.) into a manganese-catalyzed solution of 274.7 g bismaleimide triazine resin (BT206OBJ, Mitsubishi Gas Chemical) and 485 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible, partially cured composite. Several plies of this prepreg were laid up between copper foil and pressed at 250 psi in a vacuum-assisted hydraulic press at temperature of 225° C. for 90 minutes then cooled under pressure. The resulting dielectric thus produced comprised of 57 weight percent SiO$_2$, 4 weight percent PTFE and 39 weight percent adhesive, displayed good adhesion to copper, dielectric constant (at 10 GHz) of 3.2 and dissipation factor (at 10 GHz) of 0.005.

Example 4

A fine dispersion was prepared by mixing 15.44 kg TiO$_2$ powder (TI Pure R-900, DuPont Company) into a manganese-catalyzed solution of 3.30 kg bismaleimide triazine resin (BT206OBH, Mitsubishi Gas Chemical) and 15.38 kg MEK. The dispersion was constantly agitated so as to insure uniformity. A swatch of 0.0004" TiO$_2$-filled expanded PTFE (filled according to the teachings of Mortimer U.S. Pat. No. 4,985,296, except to 40% loading of TiO$_2$ and the membrane was not compressed at the end) was then dipped into the resin mixture, removed, and then dried at 165° C. for 1 min. under tension to afford a flexible, partially cured composite. The partially cured adhesive composite thus produced comprised of 70 weight percent TiO$_2$, 9 weight percent PTFE and 21 weight percent adhesive. Several plies of this prepreg were laid up between copper foil and pressed at 500 psi in a vacuum-assisted hydraulic press at temperature of 220° C. for 90 minutes then cooled under pressure. This resulting dielectric displayed good adhesion to copper, dielectric constant of 10.0 and dissipation factor of 0.008.

A particularly preferred adhesive filler dielectric relies upon the use of a spherically shaped SiO$_2$ filler that is prepared by vapor metal combustion and available from Tatsumori LTD.

Example 5

A fine dispersion was prepared by mixing 7.35 kg SiO$_2$ (ADMATECHS SO-E2, Tatsumori LTD) with 7.35 kg MEK and 73.5 g of coupling agent, i.e., 3-glycidyloxypropyltrimethoxysilane (Dynasylan GLYMO (Petrach Systems). To this dispersion was added 932 g of a 50% (w/w) solution of a cyanated phenolic resin, Primaset PT-30 (Lonza Corp.). In MEK, 896 g of a 50% (w/w) solution of RSL 1462 (Shell Resins, Inc.(CAS #25068-38-6)) in MEK, 380 g of a 50% (w/w) solution of BC-58 (Great Lakes, Inc.) in MEK, 54 g of 50% solution of bisphenol A (Aldrich Company) in MEK, 12.6 g Irganox 1010 (Ciba Geigy), 3.1 g of a 0.6% solution of Mn HEX-CEM (OMG Ltd.), and 2.40 kg MEK. This dispersion was subjected to ultrasonic agitation through a Misonics continuous flow cell for about 20 minutes at a rate of about 1–3 gal./minute. The fine dispersion thus obtained was further diluted to an overall bath concentration of 11.9% solids (w/w).

Figure 13:
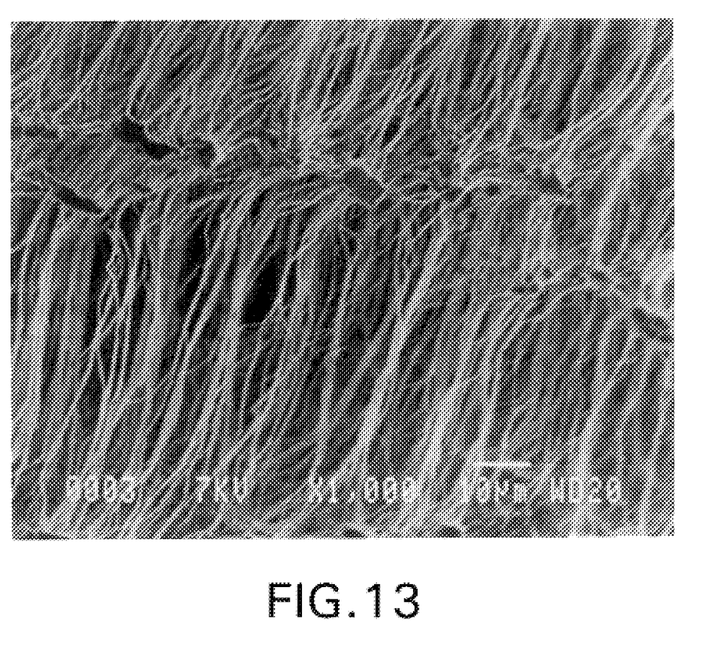
FIG. 13 is an SEM image of an alternative dielectric in which the matrix of the ePTFE material is further impregnated with a ceramic powder.

The fine dispersion was poured into an impregnation bath. A expanded polytetrafluoroethylene web having the node fibril structure of FIG. 13, and the following properties was impregnated:

| Frazier | 20.55 cf³/min/ft² |
|---|---|
| Surface Area | 9 g/m² |
| Ball Burst | 3.2 lbs |
| Thickness | 6.5 mil |
| Mean Flow Pore Size | 9.0 microns |

The Frazier number relates to the air permeability of the material being assayed. Air permeability was measured by clamping the web in a gasketed fixture which was provided with a circular area of approximately 6 square inches for air flow measurement. The upstream side was connected to a flow meter in line with a source of dry compressed air. The downstream side of the sample fixture was open to the atmosphere. Testing was accomplished by applying a pressure of 0.5 inches of water to the upstream side of the sample and recording the flow rate of the air passing through the in-line flowmeter (a ball-float rotameter that was connected to a flow meter.

The Ball Burst Strength is a test that measures the relative strength of samples by determining the maximum at break. The web was challenged with a 1 inch diameter ball while being clamped between two plates. The Chatillon, Force gauge Ball/Burst Test was used.

The ePTFE web was passed through a constantly agitated impregnation bath at a speed at or about 3 ft./min, so as to insure uniformity. The impregnated web was immediately passed through a heated oven to remove all or nearly all the solvent, and partially cure the adhesive and was collected on a roll.

Several plies of this prepeg were laid up between copper foil and pressed at 200 psi in a vacuum-assisted hydraulic press at temperature of 220° C. for 90 minutes and then cooled under pressure. This resulting dielectric displayed good adhesion to copper, dielectric constant (10 GHz) of 3.0 and dissipation factor of 0.085 (10 GHz).

Example 6

An ePTFE matrix containing an impregnated adhesive filler mixture, based on $SiO_2$ prepared from the vapor combustion of molten silicon was prepared from precursor solutions. Precursor solution I was in the form of a slurry containing a silanated silica similar to that of Example 5 and the other an uncatalyzed blend of the resin and other components.

Solution I

The silica slurry is a 50/50 blend of the SO-E2 silica of Example 5 in MEK, where the silica contains a coating of silane which is equal to 1% of the silica weight. Instead of using a silane, the silica can be coated with KR-55-tetra (2,2 diallyloxymethyl)butyl, di(ditridecyl)-phosphito titanate. To a five gallon container, 17.5 pounds of MEK and 79 grams of silane were added and the two components mixed to ensure uniform dispersion of the silane in the MEK. Then, 17.5 pounds of the silica of Example 5 were added. Two five gallon containers of the MEK-silica-silane mixture were added to a reaction vessel, and the contents, i.e., the slurry, was recirculated through an ultrasonic disperser for approximately one hour to break up any silica agglomerates that may be present. The sonication was completed and the contents of the reaction vessel were heated to approximately 80° C. for approximately one hour, while the contents were continuously mixed. The reacted mixture was then transferred into a ten gallon container.

Solution II

The desired resin blend is an MEK based solution containing an uncatalyzed resin blend (the adhesive) containing approximately 60% solids, where the solid portion is an exact mixture of 41.2% PT-30 cyanate ester resin, 39.5% RSL 1462 epoxy resin, 16.7% BC-58 flame retardant, 1.5% Irganox 1010, and 1% bisphenol A co-catalyst, all percentages by weight.

Into a ten gallon container, 14.8 pounds of PT-30 and 15–20 pounds of MEK were added and stirred vigorously to completely solvate the PT-30. Then 6 pounds of BC-58 were measured and added to the MEK/PT-30 solution and vigorously agitated to solvate the BC-58. The stabilizer, 244.5 grams of Irganox 1010 and bisphenol A, 163 grams was added. The ten gallon container was reweighed and 14.22 pounds of RSL 1462 was added. Additional MEK was added to bring the solution weight to 60 pounds. The contents were then vigorously agitated for approximately 1 to 2 hours, or as long as necessary to completely dissolve the solid components.

The desired product is a mixture of the silanated or titanated silica slurry, the uncatalyzed resin blend, and MEK in which 68% by weight of the solids are silica, and the total solids are between 5% and 50% by weight of the solution. The exact solids concentration varies from run to run, and depends in part on the membrane to be impregnated. The catalyst level is 10 ppm relative to the sum of the PT-30 and RSL 1462.

The solid contents of solutions I and II were determined to verify the accuracy of the precursors and compensate for any solvent flash that had occurred. Then solution I was added to a ten gallon container to provide 12 pounds of solids, e.g., 51% solids content, 23.48 pounds of solution I. Then solution II was added to the container to provide 5.64 pounds of solids, e.g., 59.6% solids (9.46 pounds of solution II). The manganese catalyst solution (0.6% in mineral spirits), 3.45 grams, was added to the mixture of solution I and solution II and blended thoroughly to form a high solids content solution.

The bath solution for impregnating an ePTFE matrix, 28% solids solution, was prepared by adding sufficient MEK to the high solids content solution to a total weight of 63 pounds.

Thereafter, an ePTFE matrix was impregnated with this bath solution to form a dielectric material, heated to remove solvents and partially cure the adhesive to form a B-stage product.

Example 7

A fine dispersion was prepared by mixing 26.8 g Furnace Black (SpecialSchwarz 100, Degussa Corp, Ridgefield Park, N.J.) and 79.8 g of coupling agent (GLYMO CAS #2530-83-8); 3-Glycidyloxypropyltrimethoxysilane. The dispersion was subjected to ultrasonic agitation for 1 minute, then 17.5 pounds of $SiO_2$ (SO-E2) in 17.5 pounds of MEK were added. The dispersion was heated with constant overhead mixing for 1 hour at reflux, then allowed to cool to room temperature.

Separately, an adhesive varnish was prepared by adding the following: 3413 g of a 57.5% (w/w) solution of Primaset PT-30 in MEK, 2456 g of a 76.8% (w/w) solution of RSL 1462 in MEK, 1495 g of a 53.2% (w/w) solution of BC-58 in MEK, 200 g of 23.9% (w/w) solution of bisphenol A in MEK, 71.5 g Irganox 1010, 3.21 g of a 0.6% (w/w) solution of Mn HEX-CEM in mineral spirits, and 2.40 kg MEK.

In a separate container, 3739 g of the dispersion described above was added, along with 0.0233 g of Furnace Black (SpecialSchwarz 100), 1328 g of the adhesive varnish described above and 38.3 lbs MEK. This mixture was poured into an impregnation bath, and an e-PTFE web was passed through the impregnation bath at a speed at or about 3 ft/min. The dispersion was constantly agitated so as to insure uniformity. The impregnated web is immediately passed through a heated oven to remove all or nearly all the solvent, and is collected on a roll.

Several piles of this prepreg were laid up between copper foil and pressed at 200 psi in a vacuum-assisted hydraulic press at temperature of 220° C. for 90 minutes then cooled under pressure. This resulting dielectric displayed good adhesion to copper.

Example 8

An adhesive varnish was prepared by adding the following: 3413 g of a 57.5% (w/w) solution of Primaset PT-30 (PMN P-88-1591) in MEK, 2456 g of a 76.8% (w/w) solution of RSL 1462 in MEK, 1495 g of a 53.2% (w/w) solution of BC-58 in MEK, 200 g of 23.9 % (w/w) solution of bisphenol A in MEK, 71.5 g Irganox 1010, 3.21 g of a 0.6% (w/w) solution of Mn HEX-CEM in mineral spirits, and 2.40 kg MEK.

In a separate container, 1328 g of the adhesive varnish described above, 42.3 lbs MEK, 6.40 g of Furnace Black (SpecialSchwarz 100), and 1860 g $SiO_2$ (SO-E2) were added. This mixture was poured into an impregnation bath, and an ePTFE web was passed through the impregnation bath at a speed at or about 3 ft/min. The dispersion was constantly agitated so as to insure uniformity. The impregnated web is immediately passed through a heated oven to remove all or nearly all the solvent, and is collected on a roll.

Several plies of this prepreg were laid up between copper foil and pressed at 200 psi in a vacuum-assisted hydraulic press at temperature of 220° C. for 90 minutes then cooled under pressure. This resulting dielectric displayed good adhesion to copper.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described and accordingly, all suitable modifications and equivalents may be resorted to, falling within the scope of the invention.

What is claimed is:

1. A laminated structure comprising:
   a first lamination having first and second conductive layers having inner and outer surfaces and being spaced apart by a dielectric layer, wherein the dielectric layer is an expanded polytetrafluoroethylene (PTFE) matrix impregnated with cyanate ester and epoxy;
   at least one blind via formed through the first conductive layer and dielectric layer and having a bottom coexistent with the inner surface of the second conductive layer;
   a conductive material plated into the blind via; and
   a contact pad patterned from the second conductive layer and disposed over the blind via, said contact pad having a single planar surface.

2. A laminated structure according to claim 1 further comprising a patterned conductive core element having at least one opening, the core element being placed between two dielectric layers, and the core and two dielectric layers being placed between the first and second conductive layers, thereby forming a stack, and the stack being pressed with sufficient heat and pressure to form a laminated multi-layered structure.

* * * * *